United States Patent
Cheung et al.

[11] Patent Number: 5,552,333
[45] Date of Patent: Sep. 3, 1996

[54] METHOD FOR DESIGNING LOW PROFILE VARIABLE WIDTH INPUT/OUTPUT CELLS

[75] Inventors: Gary H. Cheung, Fremont; Elias Lozano, Sunnyvale; Trung Nguyen, San Jose; Michael J. Colwell, Livermore, all of Calif.; Kevin Atkinson, Eden Prairie, Minn.

[73] Assignee: LSI Logic Corporation, Milpitas, Calif.

[21] Appl. No.: 307,942

[22] Filed: Sep. 16, 1994

[51] Int. Cl.$^6$ .................................................. H01L 21/70
[52] U.S. Cl. ............................................................. 437/51
[58] Field of Search ........................ 437/51; 257/786, 257/203; 364/491

[56] References Cited

U.S. PATENT DOCUMENTS

| | | | |
|---|---|---|---|
| 3,968,478 | 7/1976 | Mensch | 340/172.5 |
| 4,431,928 | 2/1984 | Skokan | 307/465 |
| 4,600,995 | 7/1986 | Kinoshita | 364/491 |
| 4,864,381 | 9/1989 | Seefeldt et al. | 357/45 |
| 4,910,680 | 3/1990 | Hiwatashi | 364/491 |
| 4,947,233 | 8/1990 | Aso | 357/63 |
| 4,975,758 | 12/1990 | Crafts | 357/45 |
| 4,978,633 | 12/1990 | Seefeldt et al. | 437/51 |
| 4,987,578 | 1/1991 | Akins et al. | 375/121 |
| 4,988,636 | 1/1991 | Masleid et al. | 437/51 |
| 5,045,913 | 9/1991 | Masleid et al. | 357/52 |
| 5,300,796 | 4/1994 | Shintani | 257/203 |
| 5,422,441 | 6/1995 | Iruka | 174/250 |

OTHER PUBLICATIONS

SGS–Thomson Microelectrics, "ISB35000 Series, HCMOS Structured Arrray,"(JAN. 1994).

*Primary Examiner*—Tom Thomas
*Attorney, Agent, or Firm*—Hickman Beyer & Weaver

[57] ABSTRACT

An apparatus and method of (input/output) I/O design, utilizing a predetermined relationship, whereby the outer ring area of an integrated circuit die are set aside for the I/O circuits which are contained in I/O cells. The height of the I/O cell is first reduced from the prior art cell heights, and the width of the cell is then varied according to the particular need of the circuit. When the drive strength of the I/O circuit is high, and the circuit is more complicated, a wider cell is assigned. Conversely, for a circuit that is relatively simple, a narrower cell will be assigned. Each I/O cell has one associated bonding pad which is placed directly below the starting point of that cell. The height of the cells may also be varied on each side of the chip in order to be able to place more I/O cells along one or more sides or edges of the chip.

10 Claims, 2 Drawing Sheets

METHOD FOR DESIGNING LOW PROFILE VARIABLE WIDTH INPUT/OUTPUT CELLS

FIELD OF THE INVENTION

This invention relates to integrated circuit technology and, more specifically, to a technique of varying the physical width of an input/output (I/O) cell to maximize the overall gate density.

BACKGROUND OF THE INVENTION

An essential task for a designer of Large Scale Integrated (LSI) circuits is to maximize the density of useful gates. Since an I/O circuit constitutes a significant portion of the available area on an integrated circuit chip, optimizing I/O design is an important step in achieving a higher gate density or a smaller die size.

An I/O circuit normally consists of a combination of several subcomponents including an output control drive circuit (for output), a receiver circuit (for input) and a electrostatic discharge protection (ESD) circuit. While most I/O circuits are similar in principle, the number and size of gates used can be significantly different depending on the required drive strength. The area that an I/O circuit occupies on the chip surface of the die thus differs significantly.

When choosing a die size, a designer may come across three situations. In the first situation, the function of the chip is complicated while the number of I/O pins is small. The die thus must be large enough to accommodate all the gates while the I/O is not a factor. Optimizing core area gate density is vital in minimizing die size in this situation. Another situation is when the function on the chip is relatively simple, but a large number of I/O pins are required. The die size may thus be limited by the placement of I/O cells and bonding pads. The "bonding pad rule" requires that the bonding pad spacing be larger than a certain minimum dimension. While the bonding pads are placed along the edge of the die, a large number of pads may require a large die perimeter, and thus a large die. The third situation is that the number of gates and the number of pins are comparably demanding on the die size. In the last two situations optimizing I/O design is vitally important.

One prior art technique for I/O design is the "reserve cell" technique. The designer sets aside a predetermined outer ring area of the die for I/O use. The ring area is divided into numerous slots that are equal in width. A slot is further divided into fine grids. Each I/O cell constitutes one or more I/O slots.

FIG. 1a shows a rim portion of a semiconductor integrated circuit die using prior art "reserve cell" technique. In the center of the die is the core area 4. Along the edge is the I/O ring which consists of I/O slots 2 and an area for bonding pads 3. The I/O slots are equal in width. At the lower left corner of each slot 2 is the origin mark 9, which by custom in the industry is seen to be a customized "F" on integrated circuit schematic diagrams. For each slot a bonding pad is placed directly below the origin mark. During the initial stage of circuit design, the engineer would estimate the number and size of circuit devices required for a particular I/O circuit based on the drive strength. He/she then estimates the required area for that particular circuit. Since all slots are of equal height, the engineer can then calculate the width of the cell. Knowing the width of each slot and the required width of the cell, the engineer can then determine the number of slots that are needed for that cell. When the I/O circuit is so small that the cell width required is less than the width of a slot, then a single slot is used as a "cell" for that circuit. On the other hand, when the width of a circuit is more than one slot, however, multiple slots must be combined to form a cell for that circuit. Each cell must constitute an integer number of slots. In other words, the smallest cell area unit is a slot.

FIG. 1b shows the same section of the die when the slots are combined to form cells 25. The first two cells are made of two slots each while the third cell constitutes three slots. There are two major drawbacks in this technique. The first is that much space in the I/O cell is wasted. For example, if a particular I/O circuit needs the space in the chip equal to one and a half slots, two slots will be assigned for that cell because the smallest integer number of slots that can accommodate the circuit is two. In the worst scenario, therefore, an area slightly less than a whole slot is wasted in each cell. The second drawback is bonding pad waste. As stated above, each slot has one bonding pad associated with it. For the first cell in FIG. 1b, two pads, 100 and 101, are set aside for the cell. Since each I/O cell normally requires one bonding pad, however, only bonding pad 100 is used while 101 is unused and, therefore, wasted.

The wasted I/O cell problem can be partially solved by the "integrated function" technique. When this technique is used no specific I/O area is set aside. The designer integrates the I/O circuits into the functional circuits so that "corners" left by one circuit are used by another. Because of the fully custom nature, this technique allows the designer to achieve very high gate densities. A drawback of this technique is that it is labor intensive and is not suitable for situations where a short turn-around time is essential.

When the density is controlled by the placement of bonding pads, and optimizing pad usage is necessary, the technique disclosed in U.S. Pat. No. 4,947,233, can be employed. Using this technique, one I/O cell can contain two sets of I/O circuits, and is connected to two bonding pads. While this technique aims at solving the problem of bonding pad over-crowdedness, to some extent it also helps to improve the gate density in the I/O area. When an engineer or designer has an option to fit either one or two I/O circuits into one cell, it is more likely to fill up the available area. In cases where the drive strength requirement is low, however, two circuits may occupy only a portion of the cell, leaving a large portion unused.

A solution proposed in U.S. Pat. Nos. 5,045,913 and 4,988,636, is the "ring integration" approach. Instead of designing I/O circuits individually, as is done traditionally, this method teaches designing like components of several circuits together. The designer or engineer will break several I/O circuits into components and then sort like components into groups. When like components are stacked next to each other, a mutual N-guard ring or P-guard ring can be used to replace the discrete N-guard wells or P-guard wells. For example, when several N channel driving devices are designed separately, each one needs a separate N guard well. By placing several N channel driving devices closely together in a row, one N guard ring can be shared by all the devices. Since this method arranges similar devices into banks, it is most suitably used with gate array technology. For non-gate array chips, however, since a fully custom design may require certain irregularities, this technique can not be used effectively.

An improvement over the original "reserved cell" technology is the "reduced cell" technology, where the height of a cell is reduced to about 55% of the regular "reserve cell".

In reducing the height, the internal core area is increased directly proportional to the reduction done to the height of the I/O's. A draw back of this technique is that when the height of the I/O cell is reduced, the reduced real state of the I/O area may be too small to accommodate all the implementations a designer would like to have.

It is, therefore, the intent of the present invention to optimize I/O cell design without additional labor. With the technique as presented herein, no bonding pad is assigned unless necessary and an I/O cell is just large enough for the particular implementation. This invention presents such a technique.

SUMMARY OF THE INVENTION

The objective of this invention is to provide a new technique in I/O design. The height of the I/O cell is reduced and varied in relation to the sides of the I/O cell. The variable height of the I/O cells allows a user to specify more bonding pads on one side of the integrated circuit die than the other side of the die, in accordance with the design specifications demanded by a user. The width of the cell varies depending on the drive strength of the I/O circuit that the cell needs to accommodate. Instead of changing the width of the cell by the slot, the size of the cell is fine tuned by adding or removing grids. The number of grids that a particular cell occupies depends on the drive strength of the circuit and all other options associated with input/output. Since the smallest area element in chip layout design is the grid, optimum gate density can be achieved using this new technique. To solve the problem of bonding pad overcrowdedness each I/O cell has one bonding pad associated with it and is placed directly under the starting point of the cell.

In accordance with the present invention, an integrated circuit wherein the overall gate density is maximized is disclosed. An input/output band on the periphery of the integrated circuit chip defines the area upon which will be defined the input/output cells, said band being divided into grid units. Each of the grid units is usually the smallest width unit permitted in the circuit design on the integrated circuit chip. A plurality of input/output cells are defined on the input/output band, each of which varies in width in terms of number of grid units according to the different requirements and the current, and other options, to be contained therein. A plurality of bonding pads area placed along the input/output band and area connected to the respective input/output cells. The height of the cells may also be varied on each side of the chip in order to be able to place more I/O cells along one or more sides or edges of the chip in accordance with the design specifications of the user.

DESCRIPTION OF THE DRAWINGS

For a more complete description of the invention, as well as further features thereof, reference may be had to the following description of the invention in conjunction with the drawings wherein.

DESCRIPTION OF PREFERRED EMBODIMENT

Figure 1A:
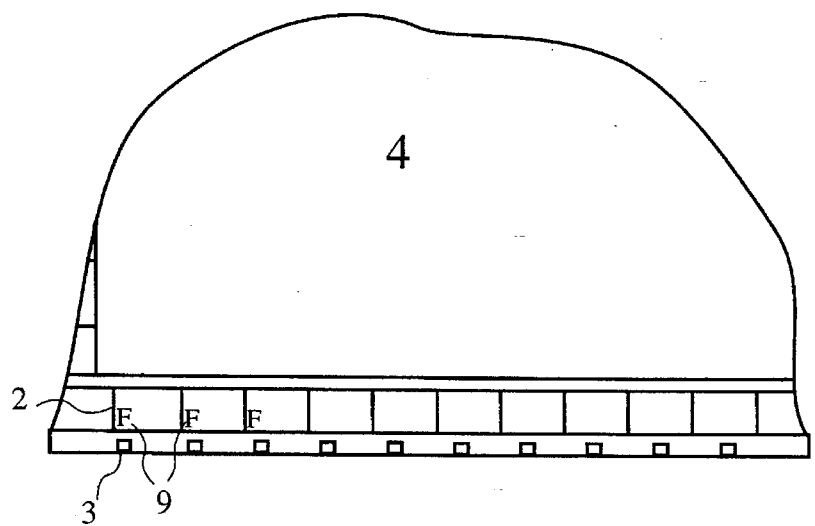
FIG. 1a is a partial view of the edge of an integrated circuit chip revealing the input/output (I/O) slots and associated bonding pads at the initial planning stage.
Figure 1B:
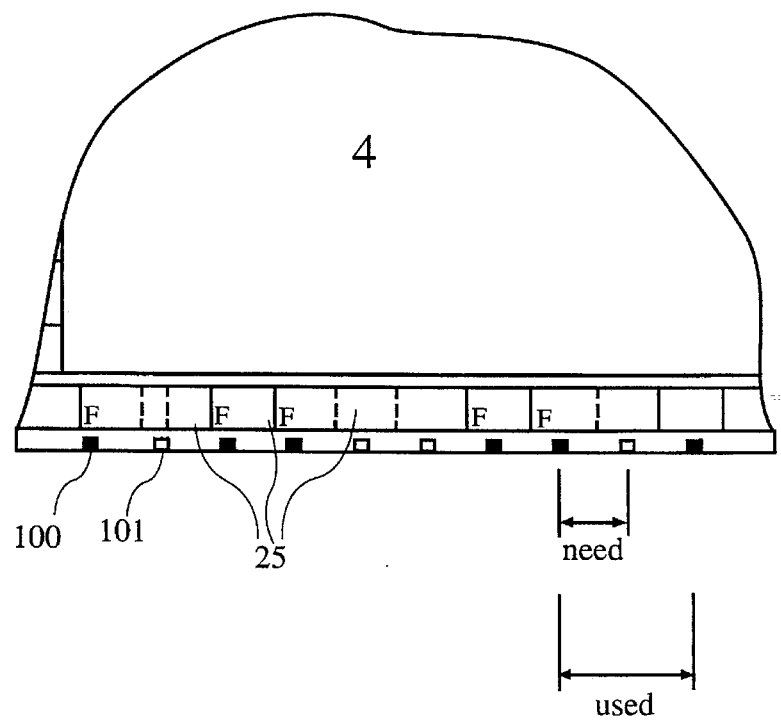
FIG. 1b is a partial view of the edge of an integrated circuit chip showing the bonding pads associated with and connected to I/O cells which constitute several I/O slots each.
Figure 2A:
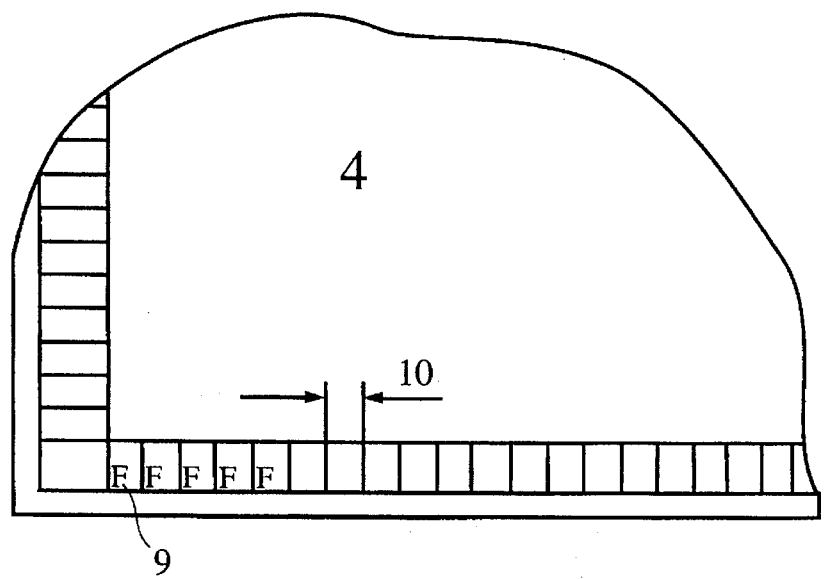
FIG. 2a is a partial view of the edge of an integrated circuit chip at the initial planning stage showing the I/O ring as divided into the minimum grid width with no bonding pads associated in accordance with the principles of the present invention.
Figure 2B:
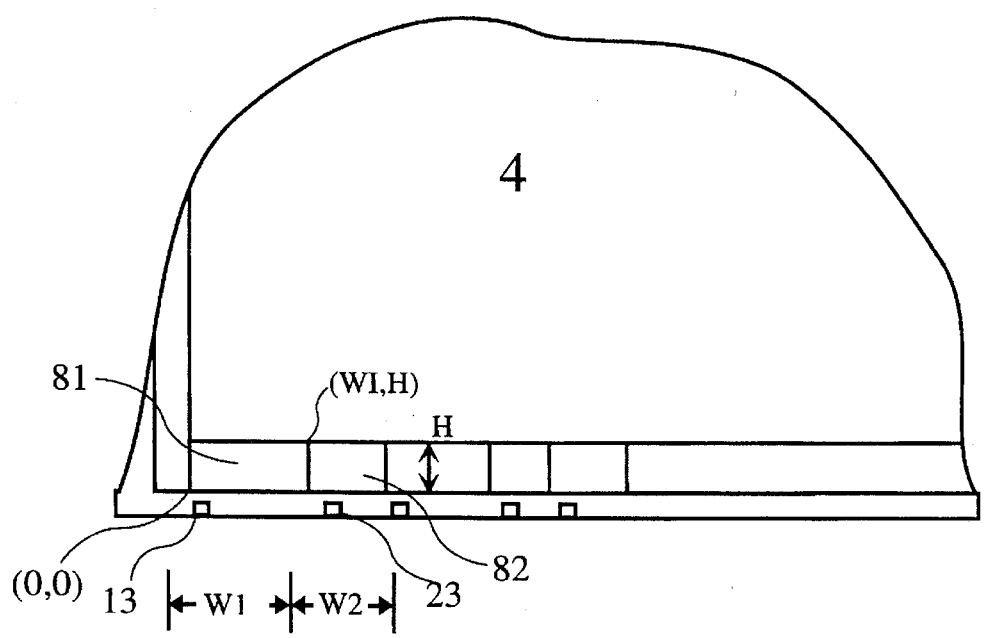
FIG. 2b is a partial view of the edge of an integrated circuit chip showing the variable width I/O cell and associated single bonding pad per I/O cell in accordance with the principles of the present invention.

In the preferred mode of this invention, the outer ring area of a semiconductor integrated circuit die is set aside as an I/O ring. The I/O ring constitutes four I/O bands, one on each side or edge of the die. The I/O band is divided into fine grids as shown in FIG. 2a. The width of a grid, 10, would usually be the smallest width unit permitted in the circuit design on the die and may be one twentieth to one eightieth of the size of a slot. At the lower left corner of each grid is the origin mark 9. The designer estimates the area of the cell from the number and size in the particular circuit of the I/O cell. Once this area is determined, the designer calculates a cell width in terms of a number of grids. Since the grid is defined by the designer as the smallest width unit, the width in grid width thus calculated is used as the actual size of the cell.

The configuration of each I/O cell, including the width, is then stored in a design library. When allocating the die area, the CAD (Computer Aided Design) tool first reads from the library the outline of a cell, and marks out an area for that cell on the die. The tool system (software) then places a bonding pad directly below the origin mark of the first grid, which is at the lower left corner of the I/O cell. The CAD tool then reads the outline of the second cell. It checks where the first cell ends, and places the second cell right next to the first cell, if it does not violate the minimum spacing from pad to pad. A bonding pad is then placed directly below the first origin mark of the second cell. If the minimum pad to pad spacing is a user input, which is a function of the package chosen. If the minimum spacing is violated, the CAD software will move the second slot further to meet the minimum spacing.

The outline of a cell is expressed in terms of the coordinates of its lower left corner and upper right corner. As an example, the outline of the cell 81 is expressed as $((0,0), (W1, H))$, where W1 is the width of cell 81 and H is the height. The procedure of placing this cell is as follows. The CAD reads the outline $((0,0), (W1,H))$. Since this is the first cell on the band, the available starting point is (0,0). A rectangular area defined by the outline $((0,0), (W1,H))$ is assigned for this cell. The program then places a bonding pad 13 directly below the starting point (0,0).

Cell 82 needs to be placed next. The CAD program reads the outline of the cell $((0,0), (W2, H))$ and checks the available space on the I/O band. It would find that the available starting point is now (W1, 0). Since the new cell is W2 wide, the area assigned for this cell is defined by $((W1, 0), (W1+W2, H))$. A bonding pad 23 would then be placed directly below the starting point of cell 82.

From the example it is easy to understand that the formula for defining the area of cell i on the I/O band is $((\Sigma W,0), (\Sigma W+Wi, H))$, where $\Sigma W$ is the length of I/O band that is occupied by all cells that are placed before cell i and Wi is the width of cell i, the cell under review at any moment.

Assuming the same cell height, H, is used for both the prior art "reduced cell" technique and the new technique, a group of I/O circuits that fill up an I/O band in the prior art "reduced cell" technique would almost certainly leave a significant portion of the band unused when designed with the new technique as disclosed herein. It is thus advantageous to reduce the height of the cells. As a guideline, the more slots that each "reduced" cell uses, the less reduction to the height can be performed. If, for example, an average I/O cell consists of n slots, an I/O circuit on the average would fully occupy the area of n–(½) slots. Thus the appropriate amount of reduction to the height of the cell can be expressed as $$H(new)/H(old)=(1-1/(2n))*100\%$$

where

H (new) is the cell height using the new technique,

H (old) is the cell height using the prior art "reduced cell" technique, and n is the average number of slots that an I/O cell consists of in the prior art "reduced cell" technique.

As an example, if an average I/O cell in the prior art technique consists of two slots, we have $$H(new)/H(old) = (1-1/(2*2))*100\%$$
$$= 75\%$$

This means for the same set of I/O circuits that would require two slots per average I/O cell in the "reduced cell" technique, in the new art it would require an I/O band that is 75 percent the height that of the "reduced cell" technique. It should be remembered that the I/O band in "reduced cell" technique is about 55 percent of the size of the "reserve cell" technique. The height of the I/O band in the present invention is then 55 percent times 75 percent, or 41 percent, that of the height of the original "reserve cell" band.

The circuit design process can be carried out recursively. For a given die size and cell height, the first round of the design is performed. If gate density in either the I/O area or the core area of the die can be significantly increased from the results of the first design, it might be desirable to do a second design. When extra space in the core area is available, the coordinating engineer may choose to reduce the core area perimeter and thus reduce the die size. On the other hand, when the I/O area is not fully used, the height H of the I/O band may be reduced. The new design would produce a set of I/O cells with reduced height H but an increased width Wi. When the aspect ratios of the I/O cells are reduced, the I/O band can be more fully used and the die size reduced. Conversely it is also possible, of course, when a given I/O band size is too small for the circuits, a new design with a larger band can be performed.

From the preceding discussion, it is seen that two advantages are gained by using this procedure. The first advantage is that very little I/O space is wasted. The maximum wasted area for each cell is a fraction of a grid width times the height of the cell. The second advantage is that no unnecessary bonding pads are placed. Bonding pads are placed only where new cells start.

Although preferred embodiments of the subject invention have been described in some detail, it will be understood by those skilled in the art that obvious variations can be made herein without departure from the spirit and scope of the invention as defined by the appended claims.

We claim:

1. A method for maximizing the overall gate density in an integrated circuit chip comprising:

defining input/output band areas along the periphery of said integrated circuit chip said periphery comprising a plurality of peripheral edges, dividing said input/output band areas into rectangular grid units having a width parallel to adjacent peripheral edge and a height perpendicular to said adjacent peripheral edge, each of said grid units having essentially the same width, defining a plurality of input/output cells comprising one or more grid units, said cells having the same height as said grid unit height, and each of said plurality of input/output cells have a cell width essentially equal to the sum of the widths of said one or more of grid units depending on the different requirements of an input/output circuit to be contained therein, and placing a plurality of bonding pads of essentially the same size along the input/output bands that are connected one each to the respective input/output cells.

2. The method as set forth in claim 1 where each of said bonding pads is associated with a particular input/output cell and each is placed next to and connected to said input/output cell such that there are no unconnected bonding pads associated with said input/output cell.

3. The method as set forth in claim 1 where the height of said input/output cells varies according to the usage of a last grid unit of said cell.

4. The method as set forth in claim 2 where the height of said input/output cells varies according to the usage of a last grid unit of said cell.

5. The method as set forth in claim 1 where said bonding pads are placed along an adjacent peripheral edge of the input/output band area.

6. The method as set forth in claim 5 where each of said bonding pads is associated with a particular input/output cell and each is placed next to and is connected to said input/output cell.

7. The method as set forth in claim 5 where the height of said input/output cells varies according to the usage of a last grid unit of said cell.

8. The method as set forth in claim 6 where the height of said input/output cells varies according to the usage of a last grid unit of said cell.

9. A method for increasing gate capacity in an integrated circuit chip comprising the steps of:

defining input/output band areas along a periphery of said integrated circuit chip, said periphery comprising a plurality of peripheral edges;

dividing said input/output band areas into rectangular grid units having a width parallel to a adjacent peripheral edge and a height perpendicular to said adjacent peripheral edge, each of said grid units having a constant width unit;

defining a plurality of input/output cells comprising one or more grid units, said cells having the same height as said grid unit height, and each of said plurality of input/output cells has a cell width related to the number of grid units depending on the different requirements of an input/output circuit to be contained therein, and said height being reduced in proportion to the amount that one or more grid units are unused;

placing a plurality of bonding pads along the input/output band that are connected to the respective input/output cells; and creating a gate area within said band areas that is increased due to the decreased in height of said cells.

10. The method for increasing gate capacity of claim 9, wherein of said bonding pads are associated with at least one of said input/output cells.

* * * * *